United States Patent
Yamamoto

(10) Patent No.: US 7,902,027 B2
(45) Date of Patent: Mar. 8, 2011

(54) METHOD OF MANUFACTURING A SEMICONDUCTOR DEVICE INCLUDING RECESSED-CHANNEL-ARRAY MOSFET HAVING A HIGHER OPERATIONAL SPEED

(75) Inventor: Hirohisa Yamamoto, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 0 days.

(21) Appl. No.: 12/604,006

(22) Filed: Oct. 22, 2009

(65) Prior Publication Data
US 2010/0041197 A1    Feb. 18, 2010

Related U.S. Application Data

(62) Division of application No. 11/836,837, filed on Aug. 10, 2007, now abandoned.

(30) Foreign Application Priority Data

Aug. 17, 2006  (JP) .................................. 2006-222158

(51) Int. Cl.
    *H01L 21/336* (2006.01)
(52) U.S. Cl. ..... 438/270; 438/287; 438/786; 257/E29.13
(58) Field of Classification Search .................. 257/288, 257/329, 330, 333, E29.13; 438/270, 272, 438/287, 786, 775, 790
    See application file for complete search history.

(56) References Cited

U.S. PATENT DOCUMENTS

| 6,020,243 | A | 2/2000 | Wallace et al. | |
|---|---|---|---|---|
| 7,148,527 | B2 | 12/2006 | Kim et al. | |
| 7,262,098 | B2 * | 8/2007 | Alessandri et al. | 438/261 |
| 2001/0016412 | A1 | 8/2001 | Lee et al. | |
| 2005/0020086 | A1 | 1/2005 | Kim et al. | |
| 2005/0236664 | A1 * | 10/2005 | Aoki et al. | 257/330 |
| 2006/0003542 | A1 * | 1/2006 | Suzuki et al. | 438/424 |
| 2006/0091482 | A1 | 5/2006 | Kim et al. | |
| 2007/0082454 | A1 | 4/2007 | Strommer et al. | |
| 2008/0029834 | A1 | 2/2008 | Sell | |

FOREIGN PATENT DOCUMENTS

| JP | 07-099310 | 4/1995 |
|---|---|---|
| JP | 2005-019473 | 1/2005 |
| JP | 2007-110125 | 4/2007 |

OTHER PUBLICATIONS

J.Y. Kim et al., "The Breakthrough in data retention time of DRAM using Recess-Channel-Array Transistor (RCAT) for 88nm feature size and beyond", 2003, Symposium on VLSI Technology Digest of Technical Papers, No. 4-89114-035-6/03.

Japanese Patent Office issued a Japanese Office Action dated Mar. 26, 2009, Application No. 2006-222158.

\* cited by examiner

*Primary Examiner* — A. Sefer
*Assistant Examiner* — Eduardo A Rodela
(74) *Attorney, Agent, or Firm* — Young & Thompson

(57) ABSTRACT

A semiconductor device includes a recessed-channel-array MOSFET including a gate electrode having a portion received in a recess. The gate insulting film has a first portion made of silicon oxide in contact with the sidewall of the recess and a second portion made of silicon oxynitride in contact with the bottom of the recess. The first portion has an equivalent oxide thickness larger than the equivalent oxide thickness of the second portion to reduce the parasitic capacitance of the gate electrode.

6 Claims, 3 Drawing Sheets

METHOD OF MANUFACTURING A SEMICONDUCTOR DEVICE INCLUDING RECESSED-CHANNEL-ARRAY MOSFET HAVING A HIGHER OPERATIONAL SPEED

CROSS REFERENCE TO RELATED APPLICATIONS

This is a division of copending application Ser. No. 11/836,837 filed on Aug. 10, 2007, which claims foreign priority to Japanese patent application No. 2006-222158. The content of each of these applications is hereby expressly incorporated by reference.

BACKGROUND OF THE INVENTION (a) Field of the Invention

The present invention relates to a semiconductor device having a recessed-channel-array MOSFET, and a method for manufacturing the same.

(b) Description of the Related Art

DRAM (Dynamic Random Access Memory) devices include an array of memory cells for storing therein information. Each memory cell includes a MOSFET formed in the surface region of a silicon substrate and a cell capacitor connected to the MOSFET, and stores electric charge in the cell capacitor by controlling the MOSFET. In recent years, the line width of interconnections in the DRAM device is drastically reduced along with the attempt of a higher memory capacity in the DRAM device. The reduction in the line width also reduces the distance between the source and the drain of the MOSFET, thereby necessitating use of a countermeasure for preventing a short-channel effect in the MOSFET.

As one of the countermeasures for preventing the short-channel effect, a recessed-channel-array MOSFET (RCAT) is known in the art. In the RCAT, a doped-polysilicon film configuring a layer of the gate electrode of the RCAT is embedded in a recess formed in the surface region of the silicon substrate. The structure of the RCAT and a method for manufacturing the same are described in a literature entitled "2003 Symposium on VLSI Technology Digest of Technical Papers", p. 11-12, for example.

In the RCAT, the recessed channel formed along the surface of the recess having a U-characteristic shape enlarges the effective channel length, thereby preventing the short-channel effect of the MOSFET.

However, there is a problem in the RCAT that the gate electrode of the RCAT has a larger parasitic capacitance compared to the conventional MOSFET because the gate electrode opposes the recessed channel having the larger length. The larger parasitic capacitance generally causes a lower operational speed of the MOSFET. For reducing the parasitic capacitance of the gate electrode in the RCAT, it may be considered to increase the thickness of the associated gate oxide film. However, the increase of the thickness of the gate oxide film increases the threshold voltage of the RCAT, thereby reducing the operational speed and increasing the power dissipation of the RCAT.

SUMMARY OF THE INVENTION

In view of the above, it is an object of the present invention to provide a semiconductor device including a RCAT having a lower parasitic capacitance and yet suppressing an increase of the threshold voltage of the RCAT to thereby increase the operational speed thereof.

It is another object of the present invention to provide a method for manufacturing the RCAT having the above advantages.

The present invention provides a semiconductor device including: a semiconductor substrate having a recess thereon; and a MOSFET including a gate insulating film formed on a surface of the recess, and a gate electrode opposing the surface of the recess with an intervention of the gate insulating film, wherein the gate insulating film includes a first portion in contact with a sidewall of the recess, and a second portion in contact with a bottom surface of the recess, and the first portion has an equivalent oxide thickness which is larger than an equivalent oxide thickness of the second portion.

The present invention also provides a method for manufacturing a semiconductor device including a recessed-channel-array MOSFET, including: forming a recess on a semiconductor substrate; forming a silicon oxide film on a surface of the recess; selectively nitriding a portion of the silicon oxide film in contact with a bottom of the recess; forming a gate electrode having a bottom portion received within the recess via the silicon oxide film; and forming source/drain regions in association with the gate electrode in a surface region of the semiconductor substrate.

The above and other objects, features and advantages of the present invention will be more apparent from the following description, referring to the accompanying drawings.

PREFERRED EMBODIMENT OF THE INVENTION

Now, an exemplary embodiment of the present invention will be described with reference to accompanying drawings.

Figure 1:
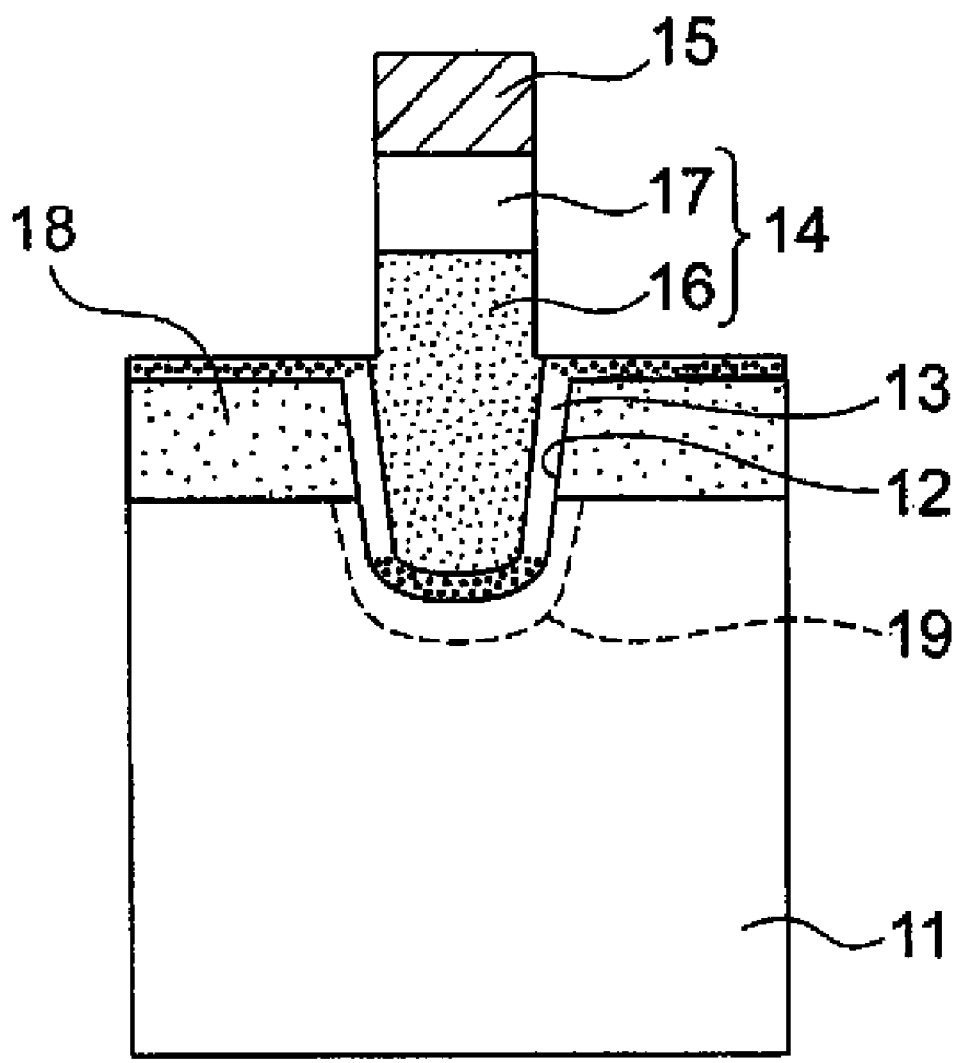
FIG. 1 is a sectional view showing the configuration of a semiconductor device according to an embodiment of the present invention.

FIG. 1 shows a semiconductor device according to an embodiment of the present invention in a sectional view. The semiconductor device, generally designated at numeral 10, is configured as a DRAM device, and includes a silicon substrate 11 on which a RCAT is formed. In the semiconductor device 10, the surface region of the silicon substrate 11 is divided into a plurality of active regions, one of which is shown in FIG. 1 and receives therein the RCAT, by using a STI (Shallow Trench Isolation) structure.

A U-shaped recess 12 is formed in the active region of the silicon substrate 11 to provide a U-shaped channel region, and a 3.0-nm-thick gate insulating film 13 is formed on the surface of the silicon substrate 11 including the internal of the recess 12. The surface of the silicon substrate 11 is oxidized using a radical oxidation process to form a gate oxide film, and a portion of the gate oxide film formed on top of the silicon substrate 11 and bottom of the recess 12 is subjected to a selective nitriding treatment by using an anisotropic plasma-enhanced nitriding process. Thus, the gate insulating film 13 includes silicon oxide on the sidewall of the recess 12, and silicon nitride on top of the silicon substrate 11 and bottom of the recess 12. The radical oxidation process may use an ISSG (In-situ steam generation) oxidation technique.

On the gate insulating film 13, there are consecutively formed a gate electrode 14 and a top protective film 15, which were patterned to have a width substantially same as the width of the recess 12. The gate electrode 14 has a poly-metal structure including a doped polysilicon layer 16, and an overlying metallic layer 17. The lower portion of the doped polysilicon layer 16 is embedded within the recess 12, and the side surface of the metallic layer 17 and upper portion of the doped polysilicon layer 16 protruding from the recess 12 is slightly retracted from the side surface of a portion of the doped polysilicon film 16 located at the top opening of the recess 12. The top protective film 15 is made of silicon nitride, for example.

Impurities are introduced into the surface region of the silicon substrate 11 to form source/drain regions on both sides of the gate electrode 14. In operation of the RCAT, channel 19 is formed along the surface of the recess 12 between the source region 18 and the drain region 18.

A sidewall protective film not illustrated in the figure is formed on the side surface of the gate electrode 14 and top protective film 15. An interlayer dielectric film overlies the gate electrode structure including the top protective film 15 and sidewall protective film. Contact plugs (not shown) penetrate the interlayer dielectric film and gate insulating film 13 to reach the source/drain regions 18, and the top of the contact plugs is connected to the cell capacitor and overlying interconnections formed on the interlayer dielectric film.

In the semiconductor device 10 of the present embodiment, the thickness of the gate insulating film 13 is 3.0 nm, and the equivalent oxide thickness of the silicon oxynitride film configuring the portion of the gate insulating film 13 formed on the bottom of the recess 12 is 2.3 nm, for example. This configuration allows the threshold voltage of the RCAT to be substantially equal to the threshold voltage of the conventional RCAT including a gate oxide film having a thickness of 2.3 nm. On the other hand, the thickness of the portion of the gate insulating film 13 formed on the sidewall of the recess 12 has a thickness of 1.3 times the thickness of the gate oxide film of the conventional RCAT, whereby the parasitic capacitance of gate electrode of the RCAT in the present embodiment is reduced down to ¾ of the parasitic capacitance of gate electrode of the conventional RCAT.

It is to be noted that the gate insulating film 13 is left on top of the silicon substrate 11 except for the portion through which the contact plugs penetrate to reach the silicon substrate 11. In addition, the portion of the gate electrode 14 protruding from the recess 12 has a width smaller than the width of the top opening of the recess 12, whereby the portion of the gate electrode 14 outside the recess 12 does not directly oppose the source/drain regions 18 of the silicon substrate 11. Thus, the parasitic capacitance of the gate electrode 14 is reduced. In an alternative, the gate insulating film 13 formed on top of the silicon substrate 11 may be removed.

Figure 2A:
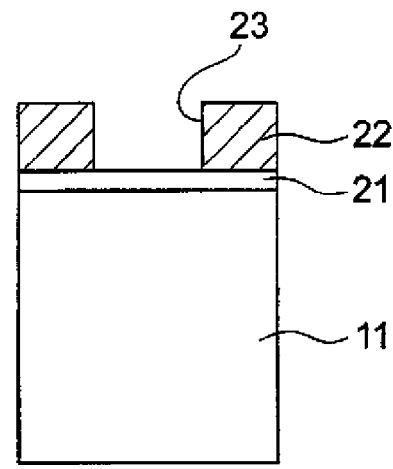
FIGS. 2A to 2F are sectional views consecutively showing steps of a process for manufacturing the semiconductor device according to an embodiment of the present embodiment.

FIGS. 2A to 2F are sectional views of a semiconductor device in consecutive steps of a process for manufacturing the semiconductor device according to an embodiment of the present invention. First, a STI (Shallow Trench Isolation) structure not shown is formed in the surface region of a silicon substrate 11 to divide the silicon substrate into a plurality of active regions, one of which is shown in FIG. 2A. A pad oxide film 21 is formed on the entire surface of the silicon substrate 11, and a silicon nitride film is formed thereon. In an alternative, the pad oxide film 21 may be omitted, and the silicon oxide film formed for the STI structure may be used instead.

Subsequently, a resist pattern having an opening corresponding to the location of the recess is formed on the mask nitride film by using a photolithographic technique. Then, the mask nitride film is patterned by a dry etching process using the resist pattern as an etching mask, to thereby pattern the mask nitride film and obtain a hard mask 22 having an opening 23 for forming therethrough the recess. The resist pattern is then removed by ashing, to obtain the structure FIG. 2A.

Figure 2B:
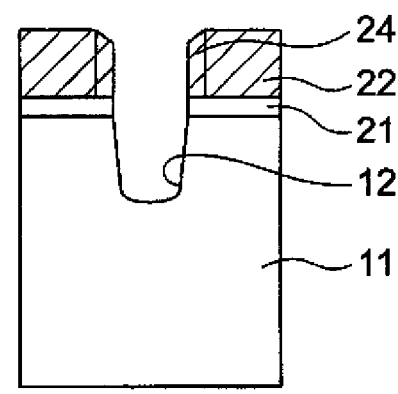

Subsequently, a thin silicon nitride film is formed on the entire surface and etched-back. The etch-back of the silicon nitride film is such that a portion of the silicon nitride film is left on the periphery of the opening 23 as a sidewall nitride film 24, which reduces the width of the opening 23. Thereafter, an etching process is performed to the pad oxide film 21 by using the mask nitride film 22 and sidewall nitride film 24 as an etching mask. Further, a dry etching process is performed to the surface of the silicon substrate 11 exposed from the patterned pad oxide film 21, thereby forming a recess 12 in the surface region of the silicon substrate 11, as shown in FIG. 2B.

Figure 2C:
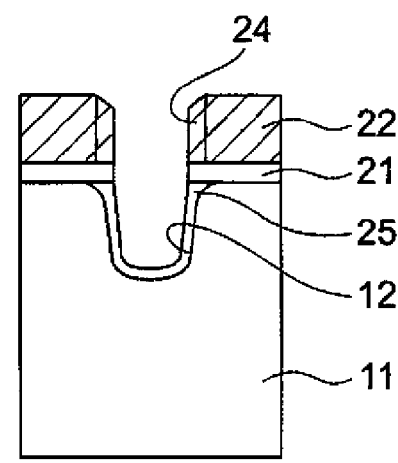
Figure 2D:
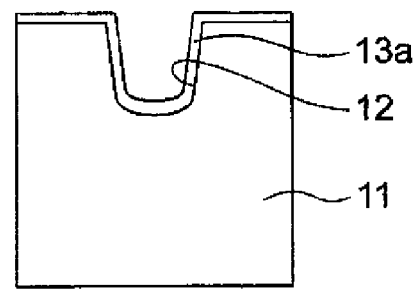
Figure 2E:
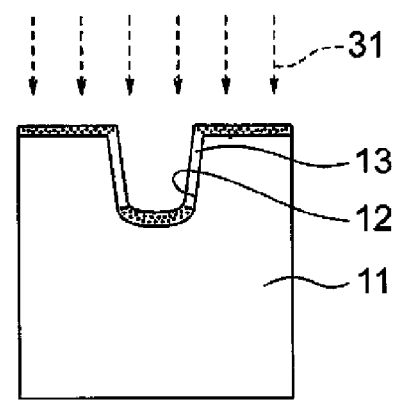

Subsequently, a sacrificial oxide film 25 is formed on the surface of the silicon substrate 11 within the recess 12 by using a radical oxidation process for the purpose of recovery of the damages caused on the surface of the recess 12 (FIG. 2C). After removing the mask nitride film 22 and sidewall nitride film 24, the pad oxide film 21 and sacrificial oxide film 25 are also removed to expose the surface of the silicon substrate 11 including the internal of the recess 12. Thereafter, another radical oxidation process is conducted to the exposed surface of the silicon substrate 11 to form a silicon oxide film 13a on the surface of the silicon substrate 11 including the internal of the recess 12, as shown in FIG. 2D.

For forming the silicon oxide film 13a, a wet oxidation process using steam, for example, may also be used instead of the radical oxidation process. In the wet oxidation process, the silicon oxide film may have a larger thickness from the bottom toward the top of the recess 12, by reflecting the crystal orientation of the silicon substrate 11. The radical oxidation process is preferable compared to the wet oxidation process, however, because the radical oxidation process generally provides a higher film quality to the silicon oxide film and thus improve the reliability of MOSFETs.

Subsequently, an anisotropic plasma-enhanced nitriding treatment is performed to the silicon oxide film 13a. The plasma-enhanced nitriding treatment is conducted under the condition of a lower chamber pressure which raises the directivity of the plasma in the direction perpendicular to the top surface of the silicon substrate 11, as shown by numeral 31 in FIG. 2E. This allows a portion of the silicon oxide film 13a on the sidewall of the recess 12 to be scarcely nitrided, and the other portion of the silicon nitride film 13a on the top of the silicon substrate 11 and bottom of the recess 12 is selectively nitrided. Thus, the resultant gate insulating film 13 includes a first portion on the sidewall of the recess 12, which is mostly made of silicon oxide, and a second portion on the top of the silicon substrate 11 and bottom of the recess 12, which is mostly made of silicon oxynitride.

The plasma-enhanced nitriding treatment is conducted, for example, at a substrate temperature of 400 degrees C. and a chamber pressure of 10 Pa, and under the presence of mixed gas including argon (Ar) and nitrogen ($N_2$) introduced at an Ar flow rate of 500 sccm (Standard Cubic Centimeters), and a $N_2$ flow rate of 50 sccm. By controlling the time length of the nitrogen treatment, the nitrogen concentration of the resultant silicon oxynitride film has a desired value, such as 15 at. %.

The mixed gas may be replaced by, for example, 100% nitrogen gas. In addition, the plasma-enhanced nitriding treatment may be replaced by ion-implantation of nitrogen into the silicon oxide film 13a. The ion-implantation process, if employed, may use a lower acceleration energy so that the implanted nitrogen does not penetrate the silicon oxide film 13a.

Figure 2F:
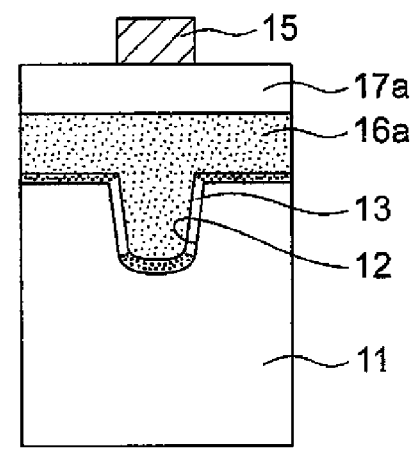

Subsequently, a doped polysilicon film 16*a* is deposited on the entire surface including the surface of the gate insulating film 13 and within the recess 12, followed by deposition of a metallic film 17*a* thereon. Thereafter, a silicon nitride film is deposited on the metallic film 17*a*, followed by patterning thereof by using a resist mask having a pattern of the gate electrode, to obtain the top protective film 15, as shown in FIG. 2F.

Subsequently, the metallic film 17*a* and polysilicon film 16*a* are consecutively patterned by a dry etching using the top protective film 15 as an etching mask, to thereby obtain the gate electrode 14 shown in FIG. 1. The gate electrode 14 includes the doped polysilicon layer 16 and metallic film 17, wherein the lower portion of the doped polysilicon film 16 is embedded within the recess 12 via the gate insulating film 13. The resist pattern used for patterning the top protective film 15 has a width slightly smaller than the width of the recess 12, whereby the side surface of the gate electrode 14 and top protective film 15 above the recess 12 is retraced from the side surface of the portion of the doped polysilicon film 16 located at the top opening of the recess 12, as shown in FIG. 1.

Thereafter, impurities are injected into the surface region of the silicon substrate 11 exposed from the gate electrode structure by using the gate electrode structure as a mask, to form source/drain regions 18. Thus, the structure of the RCAT having the recessed gate electrode 14 and associated source/drain regions 18 is obtained.

Thereafter, a thin silicon nitride film is deposited on the entire surface, and subjected to an etch-back process to form a sidewall protective film (not shown) on the side surface of the gate electrode 14 and top protective film 15. An interlevel dielectric film is then deposited to cover the entire surface including the gate electrode structure, followed by patterning thereof to form contact holes, which penetrate the gate insulating film 13 to reach the source/drain regions 18. After forming contact plugs to fill the contact holes, known processes such as forming cell capacitors on the interlevel dielectric film are conducted to complete a product DRAM device 10.

According to the semiconductor device of the above exemplified embodiment, the first portion of the gate insulating film 13 in contact with the sidewall of the recess 12 has a larger equivalent oxide thickness, to reduce the parasitic capacitance at the location wherein the gate electrode 14 opposes the source/drain region 18, whereas the second portion of the gate insulating film 13 in contact with the bottom of the recess 12 has a smaller equivalent oxide thickness, to suppresses the increase of the threshold voltage of the RCAT.

According to the method of the above embodiment, the anisotropic plasma-enhanced nitriding treatment performed to the silicon oxide film leaves the first portion of the gate insulting film to include silicon oxide, while allowing the second portion at the bottom of the recess to have a smaller equivalent oxide thickness. This specific structure of the gate insulating film is obtained by the anisotropic plasma-enhanced nitriding treatment, which does not substantially complicate the fabrication process of the semiconductor device.

In the above embodiment, a DRAM device is exemplified as the semiconductor device of the present invention; however, the present invention may be applied to any semiconductor devices, such as flash memory and logic device, including therein a MOSFET.

While the invention has been particularly shown and described with reference to exemplary embodiment and modifications thereof, the invention is not limited to these embodiment and modifications. It will be understood by those of ordinary skill in the art that various changes in form and details may be made therein without departing from the spirit and scope of the present invention as defined in the claims.

What is claimed is:

1. A method for manufacturing a semiconductor device comprising:
    forming a recess on a semiconductor substrate, wherein the recess comprising a side portion and a bottom portion disposed in the semiconductor substrate;
    forming a silicon oxide film on the side portion and the bottom portion of the recess;
    selectively nitriding the silicon oxide film on the bottom portion of the recess to form a silicon oxynitride film on the bottom portion of the recess;
    forming a gate electrode in the recess, wherein the gate electrode being contact with the silicon oxynitride film over the bottom portion of the recess, and the gate electrode being contact with the silicon oxide film over the side portion of the recess; and
    forming source and drain regions in a surface region of the semiconductor substrate,
    wherein the gate electrode being disposed between the source region and the drain region.

2. The method according to claim 1, wherein said selectively nitriding the silicon oxide film is performed by an anisotropic plasma enhanced nitriding treatment for the silicon oxide film on the bottom portion of the recess.

3. The method according to claim 1, wherein said selectively nitriding the silicon oxide film is performed by an ion-implantation of nitrogen to the silicon oxide film on the bottom portion of the recess.

4. The method according to claim 1, wherein the source and the drain regions are formed in contact with a part of the silicon oxide film over the side portion of the recess.

5. The method according to claim 3, wherein the silicon oxynitride film on the bottom portion of the recess is formed at a position lower than a position of bottom surfaces of the source and the drain regions in the semiconductor substrate.

6. The method according to claim 3, wherein the gate electrode protrudes from a top surface of the semiconductor substrate.

* * * * *